United States Patent [19]

Katsumata et al.

[11] Patent Number: 4,586,979

[45] Date of Patent: May 6, 1986

[54] METHOD FOR MANUFACTURE OF III-V GROUP COMPOUND SEMICONDUCTOR SINGLE CRYSTAL

[75] Inventors: Tooru Katsumata, Yokohama; Kazutaka Terashima, Ebina; Hiroaki Nakajima, Yokosuka; Tsuguo Fukuda, Yokohama, all of Japan

[73] Assignees: Agency of Industrial Science & Technology; Ministry of International Trade & Industry, both of Tokyo, Japan

[21] Appl. No.: 596,705

[22] Filed: Apr. 4, 1984

[30] Foreign Application Priority Data

| Apr. 4, 1983 [JP] | Japan | 58-57925 |
| Apr. 4, 1983 [JP] | Japan | 58-57926 |
| Apr. 4, 1983 [JP] | Japan | 58-57927 |
| Apr. 4, 1983 [JP] | Japan | 58-57928 |

[51] Int. Cl.$^4$ ............................................. C30B 27/02
[52] U.S. Cl. ............................. 156/601; 156/607
[58] Field of Search ............... 156/601, 602, 617 SP, 156/DIG. 70, 607; 422/249, 109

[56] References Cited

U.S. PATENT DOCUMENTS

| 3,980,438 | 9/1976 | Castonguay et al. | 156/602 |
| 4,397,813 | 8/1983 | Washizuka et al. | 422/249 |
| 4,496,424 | 1/1985 | Terashime et al. | 156/601 |

FOREIGN PATENT DOCUMENTS

| 4009169 | 1/1979 | Japan | 156/601 |
| 0056572 | 1/1981 | Japan | 156/601 |

OTHER PUBLICATIONS

Bardsley et al., "Automatic Control of Czochralski Crystal Growth" *Journal of Crystal Growth* 16, No. 3 (1972) 277-279.

*Primary Examiner*—Hiram H. Bernstein
*Attorney, Agent, or Firm*—Oblon, Fisher, Spivak, McClelland & Maier

[57] ABSTRACT

A III-V group compound semiconductor single crystal is manufactured by a method which comprises adjusting the temperature of a fused layer of raw material for the crystal, based on the electric current signal flowing between a seed crystal and the fused layer of raw material for the crystal, the weight signal of the crystal, and the length signal of the crystal, to levels optimum for the growth of crystal during the contact of the seed crystal with the fused layer, during the formation of the shoulder part of the crystal, and during the formation of the barrel part of the crystal, respectively in the process of crystal growth.

6 Claims, 21 Drawing Figures

METHOD FOR MANUFACTURE OF III-V GROUP COMPOUND SEMICONDUCTOR SINGLE CRYSTAL

BACKGROUND OF THE INVENTION

1. Field of the Invention

This invention relates to a method for the manufacture of a III-V group compound semiconductor single crystal by the liquid-encapsulated Czochralski method (LEC method).

2. Description of Prior Art

Such III-V group compound semiconductors as gallium arsenide (GaAs), gallium phosphide (GaP), indium antimonide (InSb), and indium phosphide (InP) have characteristics such as high electron mobility, ready emission of light, capability of detecting light, and ability to operate even at high temperatures and, consequently, find extensive utility as materials for microwave transistors, high-speed integrated circuits, solar cells, and photo-electron devices. Since the single crystal of GaAs, among the III-V group compound semiconductors, possesses electron mobility 5 to 6 times as high as the electron mobility of the single crystal of silicon, development of a GaAs integrated circuit is now being promoted energetically. The single crystal of InP exhibits high sensitivity to the low-loss band of the optical fiber used in optical communication and is attracting attention as a material for the future optical communication.

In order for the single crystal of GaAs to be used as a crystal substrate for an integrated circuit, it is required to possess high quality free from physical faults such as dislocation and lattice defect and from chemical faults, enjoy high intracrystalline uniformity, and enable production of a large circular wafer. As a method capable of producing the single crystal of GaAs satisfying these requirements, there may be cited the high-pressure LEC method. This high-pressure LEC method accomplishes the formation of a cylindrical single crystal of GaAs by using a low-melting glass like boron oxide ($B_2O_3$) as an encapsulant, melting GaAs under high pressure, bringing a seed crystal into contact with the resultant fused GaAs layer, and pulling the seed crystal from the fused GaAs layer while rotating it.

The temperature of the fused layer of raw material for the crystal in the process of growth into crystal is a delicate factor. In the first place, the fact that at the time the seed crystal brought into contact with the fused layer of raw material for crystal begins to be pulled from the fused layer, the fused layer is at the temperature optimum for the speed at which the growing crystal is pulled constitutes one important determinant for successful manufacture of the single crystal of high quality.

In accordance with the Czochralski method, for example, which is effected for the growth of the single crystal of silicon without use of any liquid encapsulant, it has been customary to produce the single crystal of high quality with high repeatability by following the change in weight of the seed crystal and, at the same time, consulting the optimum seed crystal contact temperature curve prepared in advance on the basis of an optimum temperature in the state of mere contact between the seed crystal and the fused layer of raw material for the crystal. In accordance with the method for the production of a III-V group compound semiconductor single crystal by the use of a liquid encapsulant, however, since the seed crystal is susceptible to the buoyancy originating in the liquid encapsulant, the signal indicating detection of a change in weight of the seed crystal has low reliability because of its high noise content. Besides, the method which uses the optimum seed crystal contact temperature curve based on the optimum temperature in the state of mere contact between the seed crystal and the fused layer of raw material necessitates correction of the actual seed crystal pulling rate with reference to the temperature curve. It is extremely difficult to have the temperature of the interface of the fused layer of raw material for the crystal adjusted at all times accurately within only ±0.5° C. of the optimum level relative to the crystal pulling rate. As a result, in the adjustment of the temperature of the fused layer of raw material for the crystal to be made while the seed crystal is being brought into contact with the fused layer of raw material and it is being pulled out of the fused layer there is no alternative but to rely upon the skill of an operator for temperature adjustment. The adjustment performed in this manner is not repeatable and has so far formed a bottleneck in the complete automation of the manufacture of single crystal.

SUMMARY OF THE INVENTION

An object of this invention is to provide a method for the manufacture of a III-V group compound semiconductor single crystal of high quality with high repeatability.

Another object of this invention is to provide a method for the manufacture of a III-V group compound semiconductor single crystal which is readily adaptable to total automation of the manufacture of single crystals.

To accomplish the objects described above, this invention effects the formation of the single crystal by adjusting to the optimum levels the temperatures at which the seed crystal is brought into contact with the fused layer of raw material for the crystal and then pulled from the fused layer during the step for the growth of single crystal, the temperature of the fused layer of raw material for the crystal during the formation of the shoulder part of the crystal, and the temperature of the fused layer during the formation of the barrel portion of the crystal on the basis of data such as a signal indicating the weight of the crystal, a signal indicating the length of the crystal, and a signal indicating the magnitude of electric current flowing to the seed crystal, which are measured during the step of crystal growth. Consequently, this invention enables the single crystal to be produced in high quality.

Since the adjustment of the temperature of the fused layer of raw material for the crystal to the optimal level is carried out by the comprehensive judgment based on the data obtained during the growth of the crystal, the single crystal can be produced in high quality with high repeatability and the process of forming this crystal can be easily adapted for a fully automated system.

BRIEF DESCRIPTION OF THE DRAWINGS

The other objects and characteristics of this invention will become apparent from the further disclosure of the invention to be made in the following detailed description of a preferred embodiment, with reference to the accompanying drawings, in which.

DESCRIPTION OF PREFERRED EMBODIMENT

Figure 1:
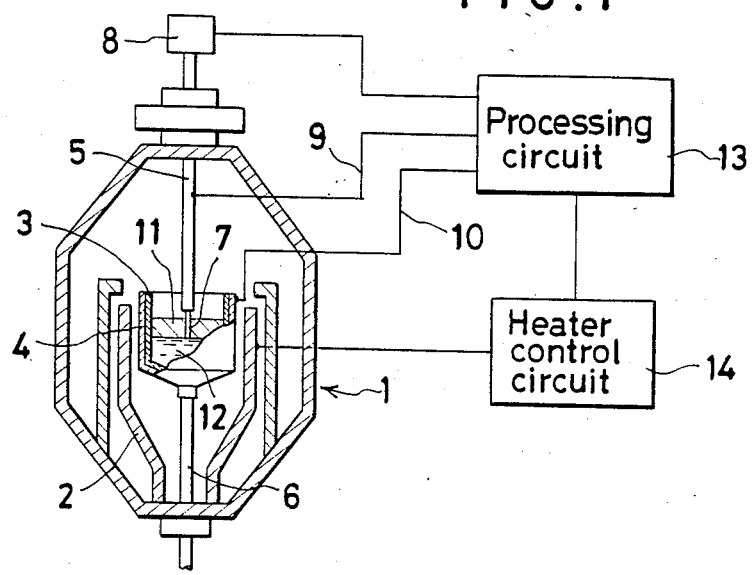
FIG. 1 is a schematic view of an apparatus for the manufacture of single crystals by the use of a liquid encapsulant, for illustration of the present invention.

I. Adjustment of Temperature of Fused Layer of Raw Material for Crystal at Time of Contact of Seed Crystal First, the method which effects the pulling of a single crystal after the molten mass of raw material for the crystal has been adjusted to the optimum temperature relative to the crystal pulling rate set in advance will be described. FIG. 1 represents a schematic view of an apparatus for the manufacture of a compound semiconductor single crystal by the use of a liquid encapsulant under a high pressure. Inside a high-pressure chamber 1, a crucible 3 having the periphery thereof covered with a crucible supporting member 4 such as of a carbonaceous material is disposed. This crucible 3 is rotatably supported in place by a rotary support shaft 6. Around the crucible 3 is disposed a heater 2 which heats and keeps the crucible 3 at a stated temperature by means of the signal from a heater control circuit 14. Above the crucible 3 is disposed an electroconductive pulling shaft 5 having a seed crystal 7 fitted in place at the lower end thereof. This pulling shaft 5 is adapted so as to be rotated about the axis thereof and, at the same time, moved vertically along the axis. It is provided at the upper end thereof with a weight sensor 8 adapted to sense weight and forward the weight value to a processing circuit 13. Lead wires 9, 10 are connected respectively to the pulling shaft 5 and the supporting member 4 so as to apply voltage therebetween. The magnitude of the electric current is forwarded to the processing circuit 13. In the processing circuit 13, the standard pattern of optimum temperature relative to the crystal pulling rate has been stored. This processing circuit 13 compares the weight signal and the electric current signal delivered thereto as described above with the standard pattern and forwards a signal indicating the difference found by this comparison to the heater control circuit 14 so as to effect adjustment of the temperature of the heater 2. In the aforementioned control circuit 14, the temperature of the heater 2 is adjusted in accordance with the incoming signal.

In the apparatus constructed as described above, III group and V group elements destined to form a desired III-V group compound are placed in stated amounts in the crucible 3 and $B_2O_3$ is further added thereto as a liquid encapsulant. The crucible 3 is set in place inside the high-pressure chamber 1. The interior of the chamber 1 is pressed with an inert gas such as argon or nitrogen. Then, the crucible 3 is heated by the heater 2 to a temperature exceeding the temperatures at which the elements as raw materials for the crystal are melted. Examples of the III-V group compounds include GaAs, GaP, InSb, and InP.

In consequence of the heating, the charge in the crucible 3 produces an upper fused layer 11 of $B_2O_3$ as an encapsulant and a lower fused layer 12 of raw material for the crystal. After the raw material in the crucible 3 has been thoroughly fused, the pulling shaft 5 is lowered to bring the seed crystal 7 into contact with the fused layer 12 of raw material.

Figure 2A:
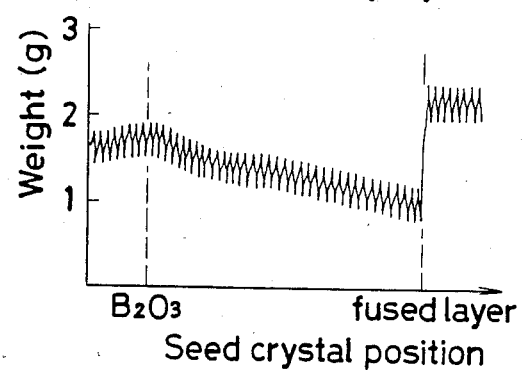
FIG. 2(A) is a graph showing change in the weight signal at the time a seed crystal is brought into contact with the interface between the liquid encapsulant and the fused layer of raw material for the crystal.

The weight signal for the seed crystal which the weight sensor 8 transmits to the processing circuit 13 between the time the leading end of the seed crystal 7 comes into contact with the surface of the fused layer 11 of $B_2O_3$ and the time the leading end reaches the fused layer 12 of raw material varies as illustrated in FIG. 2(A). From this graph, it is noted that the weight of the seed crystal 7, when the seed crystal 7 is brought into contact with the surface of the fused layer 11 of $B_2O_3$, begins to decrease and continues to decrease gradually thereafter until the leading end of the seed crystal reaches the surface of the fused layer 12 of raw material and, when the surface of the fused layer of raw material is reached, the weight of the seed crystal abruptly increases because the leading end of the seed crystal is melted in the fused layer of raw material. Since this weight signal is actually measured inside the high-pressure chamber, it inevitably contains numerous noise components such as the fluctuation of weight due to pressure and the frictional slide of the pulling shaft against the sealing member. Thus, the output signal actually detected is not so clear and definite as shown in FIG. 2(A). It is, accordingly, difficult to determine the accurate position of the seed crystal exclusively from the weight signal. After the seed crystal comes into contact with the fused layer of raw material, however, the weight signal decreases with the rising temperature of the fused layer and increases with the falling temperature thereof. Thus, the temperature condition at the interface of the fused layer of raw material can be estimated by following the time-course change in the weight signal and determining the inclination of the change in weight.

Figure 2B:
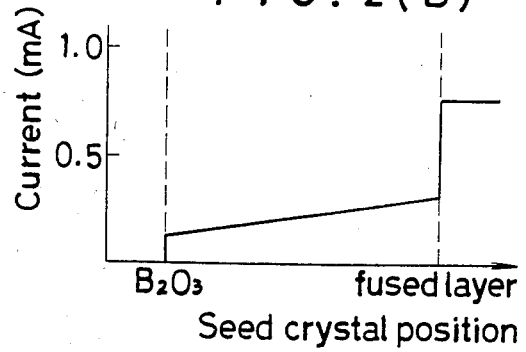
FIG. 2(B) is a graph showing change in the electric current signal in the state of FIG. 2(A).

A DC or AC voltage is applied between the pulling shaft 5 and the crucible supporting member 4 through the lead wires 9, 10. Since the crucible 3 and the fused layer of $B_2O_3$ become electroconductive at high temperatures, flow of an electric current is detected as illustrated in FIG. 2(B) when the leading end of the seed crystal 7 comes into contact with the fused layer of $B_2O_3$. The magnitude of this electric current gradually increases until the leading end of the seed crystal reaches the surface of the fused layer 12 of raw material. When the seed crystal comes into contact with the fused layer of raw material, the magnitude of electric current detected abruptly increases because the electroconductivity of the fused layer is much higher than that of the fused layer of $B_2O_3$. The electric current signal contains virtually none of the noise components such as are caused by high temperature and high pressure. Thus, the contact of the seed crystal with the fused layer of $B_2O_3$ and that with the fused layer of raw material can be accurately determined.

Now the adjustment of the temperature of the fused layer of raw material for the crystal will be described. The stage between the time the seed crystal comes into contact with the fused layer of raw material and the time the seed crystal is on the verge of being pulled up is divided into four steps, i.e. (1) the step for sensing the contact of the seed crystal, (2) the step for sensing the stable region, (3) the step for adjusting the metastable region, and (4) the step for adjusting the stable region. In each of these four steps, the weight signal and the electric current signal detected as described above are compared with the standard pattern set in advance and, based on the results of this comparison, the fused layer of raw material is adjusted so as to retain the optimum temperature condition relative to the crystal pulling rate set in advance.

(1) Step for Sensing Contact of Seed Crystal;

This step covers the period between the time seed crystal is set moving downwardly and the time it is brought into contact with the fused layer of raw material for the crystal. The standard patterns of the weight signal and the electric current signal varying between the time the seed crystal is set moving downwardly and the time it is brought into contact with the fused layer of raw material are as shown respectively in FIGS. 2(A), 2(B). The contact of the seed crystal with the fused layer of raw material is sensed by comparing the output signals obtained as described above with the aforementioned standard patterns. Since the contact between the seed crystal and the fused layer of raw material is detected mainly based on the electric current signal which has a low noise content, the resultant signal indicating the detection is amply reliable.

(2) Step for Sensing Stable Region The downward movement of the pulling shaft which has the seed crystal fitted in place at the lower end thereof is stopped as soon as the contact of the seed crystal with the fused layer of raw material is detected in the preceding step for sensing the contact of the seed crystal. This step is aimed at determining the temperature condition at the interface of the fused layer of raw material with which the seed crystal is held in contact.

Figure 3A:
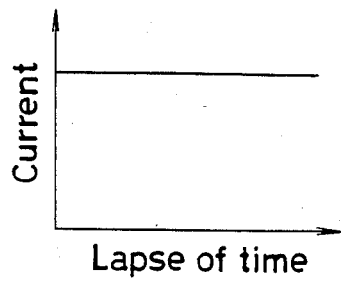
FIG. 3(A) is a graph showing the magnitude of the electric current at the time that the seed crystal is brought into contact with the fused layer of raw material for the crystal.
Figure 3B:
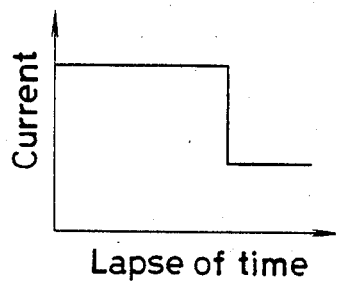
FIG. 3(B) is a graph showing the magnitude of the electric current at the time that the seed crystal has got out of contact with the fused layer of raw material for the crystal.

After the stop of the movement of the pulling shaft, the seed crystal is left standing as held in contact with the fused layer of raw material for a preset period, e.g. for about 10 minutes. A fixed magnitude of electric current as illustrated in FIG. 3(A) is detected so far as the state of contact between the seed crystal and the fused layer of raw material continues to exist. If the temperature of the fused layer of raw material is higher than the melting point of the seed crystal, however, the seed crystal is melted and the contact between the fused layer and the seed crystal is broken. Consequently, the electric current abruptly decreases and assumes a pattern as illustrated in FIG. 3(B).

Figure 4A:
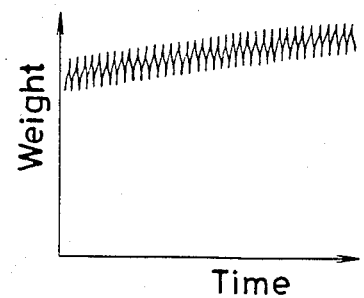
FIG. 4(A) is a graph showing the state of the weight signal in which the fused layer of raw material for the crystal is at the optimum temperature for the pulling of crystal.
Figure 4B:
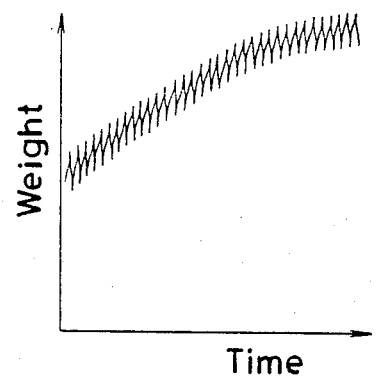
FIG. 4(B) is a graph showing the state of the weight signal in which the fused layer of raw material for the crystal is at a temperature below the optimum crystal pulling temperature.

The electric current signal remains substantially constant as illustrated in FIG. 3(A) in the case where the temperature of the fused layer of raw material is in a state permitting the pulling of crystal to be started and in the case where the temperature of the fused layer of raw material is sufficiently lower than the aforementioned temperature for the pulling of crystal to be started. These two cases cannot be discriminated from each other exclusively by the electric current signal. On the other hand, the discrimination between these two cases can be obtained by the time-course change in the weight signal. When the fused layer of raw material has already reached the state permitting the pulling of crystal to be started, the weight signal is either constant or is gradually increased as illustrated in FIG. 4(A). When the temperature of the fused layer is low, however, the weight signal shows an inclination to increase with the elapse of time as illustrated in FIG. 4(B). This inclination toward increase intensifies in proportion as the temperature is low. The temperature condition at the interface of the fused layer of raw material, therefore, can be estimated relatively based on the degree of change in the weight signal.

Figure 4C:
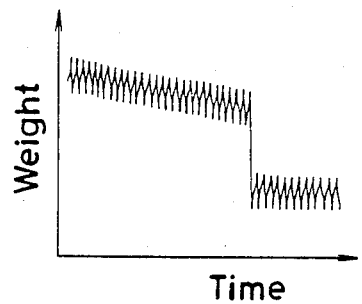
FIG. 4(C) is a graph showing the state of the weight signal in which the fused layer of raw material for the crystal is at a temperature higher than the optimum crystal pulling temperature.

When the temperature of the fused layer of raw material is high, the weight signal decreases as illustrated in FIG. 4(C). The weight signal abruptly decreases when the seed crystal breaks its contact with the fused layer of raw material.

In this step, the temperature condition in the neighborhood of the interface in which the fused layer remains in contact with the seed crystal is detected mainly based on the time-course change in the weight signal as described above. When the fused layer of raw material is judged as suitable for pulling of crystal, it is adjusted to the temperature optimum for crystal growth in the next step for adjusting the stable region. In the step for adjusting the metastable region, the fused layer of raw material which has a higher or a lower temperature than the optimum temperature is adjusted to the level permitting the pulling of crystal to be started.

(3) Step for Adjustment of Metastable Region

Figure 5:
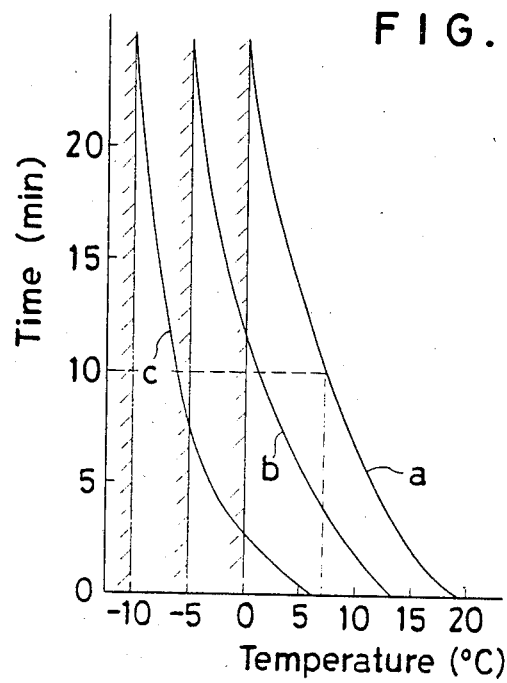
FIG. 5 is a graph showing the relation between the crystal pulling rate and the change in temperature.

This step is aimed at determining the degree of temperature compensation where temperature of the fused layer of raw material is lower than the level permitting the pulling of crystal to be started. First, the case in which the temperature of the fused layer is too high will be described. The temperature at which the crystal can be pulled by the LEC method is plotted by taking into due consideration the kinds of elements selected as raw materials, the mixing ratio of such elements, the construction and scale of the apparatus, the conditions for fusing the raw material for the crystal, and the pulling rate of the seed crystal, etc. The graph of FIG. 5 represents a typical curve so obtained of GaAs single crystal. In the graph, the vertical axis is the scale for the duration between the time the seed crystal is brought into contact with the fused layer of raw material and the time the grown single crystal is severed and the horizontal axis the scale for the temperature to be compensated. The curve "a" represents the results obtained where the rate of crystal pulling is 0 mm/hour, the curve "b" those obtained where the rate is 10 mm/hour, and the curve "c" those obtained where the rate is 20 mm/hour, respectively. The hatched portions indicate the regions of temperatures in which the pulling of crystal can be effected at the indicated rates. In the step for sensing the stable region, the duration between the time the seed crystal is brought into contact with the fused layer of raw material for the crystal and the time the grown single crystal is severed is measured in advance. The magnitude of temperature to be lowered by way of compensation, therefore, can be found by applying this duration to the vertical axis of the aforementioned graph. Assume a case wherein the severance of the grown single crystal is estimated to occur on elapse of 10 minutes after the time the seed crystal is brought into contact with the fused layer, then the severance will be avoided by lowering the temperature of the fused layer by about 7° C. as indicated by the dotted line. When the pulling rate of the seed crystal during the crystal growth is fixed at 10 mm/hour, the fused layer can be brought to the temperature condition befitting the crystal pulling by having its temperature lowered by about 12° C. After the temperature of the fused layer of raw material for the crystal has been lowered to a stated level by suitably controlling the temperature of the heater, the seed crystal is again brought into contact with the fused layer as already described in the section dealing with the step for sensing contact of seed crystal and the decision as to whether or not the temperature of the fused layer has reached the level befitting the pulling of crystal is made based on the electric current signal and the weight signal.

An excessively low temperature of the fused layer cannot be sensed in the light of change in the electric current signal. It is, therefore, detected on the basis of the time-course change in the weight signal. The weight signal continues to increase and, on elapse of a certain length of time, levels off to a constant value. Thus, the width of temperature to be increased by way of compensation is to be determined by taking into due account the ratio of increase in the weight signal, the length of time required for the weight signal to reach the constant value, and so on.

Specifically, the procedure for this compensation comprises the steps of first severing the seed crystal, then increasing the operating temperature of the heater by a stated width and, after the temperature of the fused layer of raw material has been elevated as required, bringing the seed crystal again into contact with the fused layer of raw material, and making the decision as to whether or not the fused layer has reached the temperature befitting the pulling of crystal based on the electric current signal and the weight signal.

(4) Step for Control of Stable Region

Figure 6:
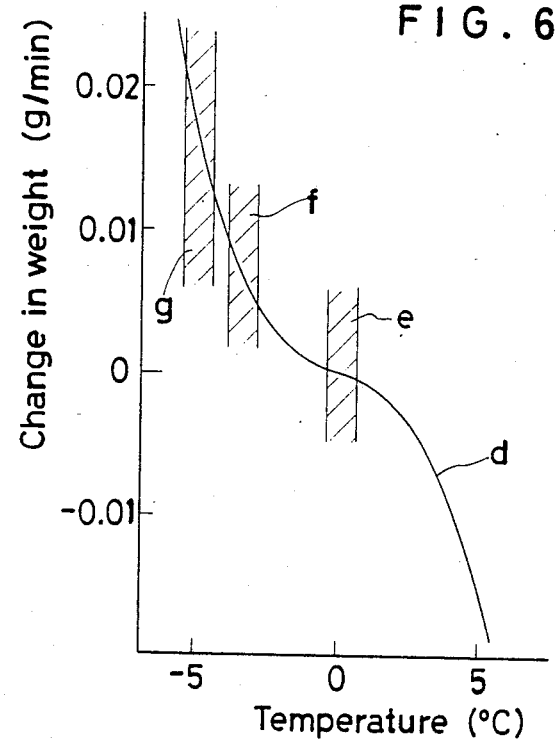
FIG. 6 is a graph showing a typical relation between the change in weight of the fused layer of raw material for the crystal and the range of the optimum temperature.

After the fused layer has been judged, in the step for sensing the stable region, to have reached the temperature befitting the pulling of crystal, it is further treated in this step to have its temperature more accurately adjusted to the optimum level for the pulling of crystal on the basis of the amount of change in weight per unit time which is to be found through elaborate analysis of the weight signal obtained as illustrated in FIG. 4(A). A typical standard pattern to be used in this step with respect to the GaAs single crystal is shown by the graph of FIG. 6. In this graph, the vertical axis represents the scale for the amount of change in weight per unit time and the horizontal axis the scale for the width of temperature required for compensation. In this graph, the curve "d" shows the relation between the optimum width of temperature to be elevated and the change in the weight of crystal, the zone "e" represents the region of optimum temperature where the crystal pulling rate is fixed at 0 mm/hour, the zone "f" the region of optimum temperature where the crystal pulling rate is fixed at 10 mm/hour, and the zone "g" the region of optimum temperature where the crystal pulling rate is fixed at 20 mm/hour, respectively. Assume a case wherein the change in weight of the fused layer adjusted to the pulling rate of 10 mm/hour is 0.01 g/min, for example, then it will be noted from FIG. 6 that the existent temperature of the fused layer is about 1° C. lower than the optimum temperature for the pulling rate of 10 mm/hour. In this case, therefore, the fused layer can be adjusted to the optimum temperature for the particular pulling rate of 10 mm/hour by adjusting the operating temperature of the heater so as to elevate the temperature of the fused layer by 1° C. As described above, in this step, the fused layer which has been brought to the temperature befitting the pulling of crystal is further adjusted to the optimum temperature for the pulling of crystal.

The operation involved between the time the seed crystal is brought into contact with the fused layer of raw material for the crystal and the time the seed crystal is pulled up will be described with reference to FIG. 1 and the steps explained above. The seed crystal 7 is brought into contact with the fused layer 12 of raw material for the crystal, and the weight signal and the electric current signal which are consequently issued are measured and continuously forwarded to the processing circuit 13. When, in the two types of signals thus brought in to the processing circuit, the signal of the magnitude of electric current sharply increases, the processing circuit senses this sharp rise of the signal and perceives the occurrence of contact between the seed crystal and the interface of the fused layer of raw material and consequently causes a stop of the descent of the seed crystal 7 (Step for sensing contact of seed crystal). Then, the two output signals are measured for a stated length of time with the seed crystal kept in contact with the fused layer. Particularly when the change in the weight signal remains within the allowable range over this period, the fused layer is judged to be at the temperature befitting the pulling of crystal (Step for sensing stable region). Then, in the subsequent step for control of stable region, the fused layer is adjusted to the optimum temperature for the crystal pulling rate. After this adjustment, the operation of pulling the crystal is started.

In the step for sensing the stable region, a sudden decrease in the magnitude of electric current signal signifies occurrence of severance of the seed crystal owing to an excessively high temperature of the fused layer. In the processing circuit 13, the values of optimum temperatures classified by the crystal pulling rate as illustrated in the graph of FIG. 5 are memorized. The processing circuit, therefore, determines the width of fall of the temperature of the fused layer based on the length of time elapsing before the severance of the seed crystal and the crystal pulling rate, issues a corresponding signal to the heater control circuit 14 and lowers the operating temperature of the heater 2 by a stated magnitude. When the change in the weight signal deviates from the allowable range while the electric current signal remains constant, this deviation of the change signifies occurrence of an excessively low temperature of the fused layer. In this case, the processing circuit compares the magnitude of temperature to be increased with the value for correction stored therein and, depending on the difference, adjusts the operating temperature of the heater so as to elevate the temperature of the fused layer enough for required compensation (Step for adjustment of metastable region). In any of the cases dealt with above, after the temperature of the fused layer has been adjusted, the seed crystal is again brought into contact with the fused layer and the weight signal and the electric current signal are analyzed to determine whether the temperature of the fused layer has reached the level befitting the pulling of crystal.

As described above, the present invention contemplates sensing the temperature condition near the interface of the fused layer by actually bringing the seed crystal into contact with the fused layer, adjusting the temperature of the fused layer to the optimum level for the pulling of crystal, and, after confirmation of the adjustment, starting the operation of crystal pulling to effect the manufacture of the single crystal by the LEC method. Thus, the invention enables highly delicate adjustment of the temperature of the fused layer to be carried out easily and permits the pulling of crystal to be started at all times under the optimum temperature condition. In the initial stage of the crystal pulling thus started, the shoulder part of the crystal is formed.

II. Adjustment of Temperature of Fused Layer of Raw Material during Formation of Shoulder Part of Crystal The change in distribution of dislocation and the possibility of occurrence of polycrystals and twin decrease in proportion as the smoothness of change in shape of the shoulder part relative to the axial direction of the crystal increases. From the economic point of view, however, it is more desirable to shorten the shoulder part of the crystal as much as possible in the sense that the number of wafers of uniform size to be cut from the produced single crystal increases with the decreasing size of the shoulder part. Let $\theta$ stand for the angle of the shoulder part relative to the axial direction of the crystal, and the single crystal to be produced will acquire better properties when the angle $\theta$ is smooth and the single crystal will prove more desirable economically when the angle $\theta$ approaches 90°. Thus, the angle is selected at its ideal value in due consideration of the physical properties and others. During the growth of the crystal, the operating conditions are controlled so that the shape of the shoulder part of the growing crystal may approach the ideal angle $\theta$ as much as possible.

Heretofore, the shape of the shoulder part of the growing crystal has been controlled by continuously weighing the growing crystal and using the resultant differential values as the standard signal. This control has proved complicated.

In the present invention, the angle of the shoulder part is used as the basic signal for the control of the shape of the shoulder part in place of the aforementioned differential values.

The diameter "D" of the growing crystal can be determined from the measured value $\Delta W$ of the amount of change in weight of the crystal and the length "l" of crystal pulling in accordance with the formula (1) given below.

$$D = 2\sqrt{\frac{\Delta W}{\pi \cdot \rho s \cdot \Delta l}} \qquad (1)$$

In the formula (1), $\rho s$ denotes crystal density.

Then, the angle $\theta$ of the shoulder part of the crystal can be calculated in accordance with the formula (2) given below.

$$\theta = \tan^{-1}\left\{\frac{D_n - D_{n-1}}{2(l_n - l_{n-1})}\right\} \qquad (2)$$

Constant equalization of the actual angle of the shoulder part of the growing crystal with the preset angle $\theta_0$, therefore, is attained by determining the amount of compensation for the operating temperature of the heater on the basis of the difference between the detected angle $\theta$ of the shoulder part and the preset angle $\theta_0$ and controlling the temperature of the heater accordingly.

Figure 7:
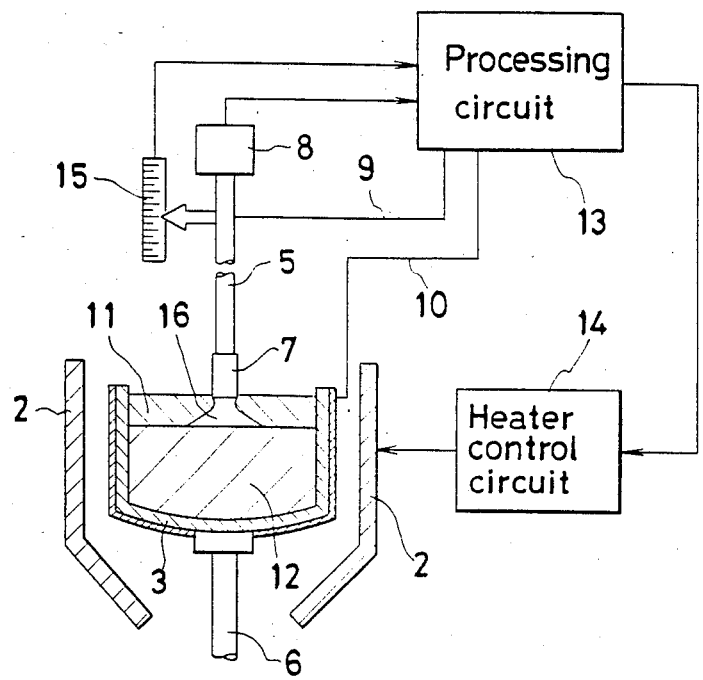
FIG. 7 is a schematic view of an essential part of another apparatus for the manufacture of single crystals in accordance with this invention.

In FIG. 7, when the seed crystal 7 is brought into contact with the fused layer 12 of raw material for the crystal which has been adjusted to the optimum temperature proper to the crystal pulling rate and this seed crystal is pulled up from the fused layer, there first ensues the formation of the shoulder part 16 of the crystal. As soon as the pulling of the seed crystal is started, the weight of the crystal and the length of crystal pulling are measured by the weight sensor 8 and the position sensor 15 disposed on the pulling shaft 5. The values of these determinations are continuously forwarded to the processing circuit 13. In the processing circuit 13, the diameter of the crystal is calculated from the weight signal and the pulling length signal in accordance with the formula (1). Then, based on the ratio of increase in the diameter of the crystal, the angle $\theta$ of the shoulder part of the growing crystal is calculated in accordance with the formula (2). This angle of the shoulder part of the crystal is mainly determined by the conditions for the pulling of the single crystal and the temperature of the fused layer of raw material, i.e. the operating temperature of the heater 2. When the pulling rate of the seed crystal is fixed, the angle of the shoulder part of the crystal increases with the decreasing temperature of the fused layer and decreases with the increasing temperature of the fused layer.

In the processing circuit 13, the angle of the shoulder part of the growing crystal calculated in the circuit is compared with the preset angle of the shoulder part. When the two angles are found to differ, the signal of the value of compensation for the temperature which corresponds to the difference of the two angles is forwarded to the heater control circuit 14 to effect required control of the temperature of the heater so as to make the angle of the shoulder part of the growing crystal to approach the present value as much as possible.

Figure 8:
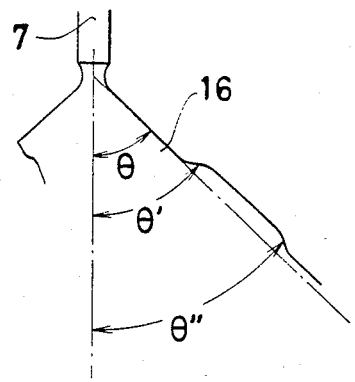
FIG. 8 is an explanatory view showing the state in which the shape of the shoulder part of the crystal is controlled.

FIG. 8 is an explanatory diagram illustrating the conditions under which the formation of the shoulder part of the crystal is controlled. It is now assumed that the shape of the shoulder part of the crystal which has been growing at an angle of $\theta$, after elapse of a certain length of time, is changed to the shape of a new angle of $\theta'$. The processing circuit immediately senses this change in shape, issues a signal indicating the value of compensation for temperature corresponding to the amount required to reduce the angle by the difference of $\theta' - \theta$, forwards this signal to the heater via the heater control circuit, and consequently elevates the temperature of the fused layer accordingly. As a result, the crystal is allowed to grow, with the angle of the shoulder part changed to the original value. When the angle $\theta$ is decreased to a smaller angle $\theta''$ after elapse of a certain length of time, the processing circuit forwards the value of compensation for temperature required to increase the angle by the difference of $\theta'' - \theta$ to the heater and consequently allows the crystal to continue its growth at the original angle.

Figure 9A:
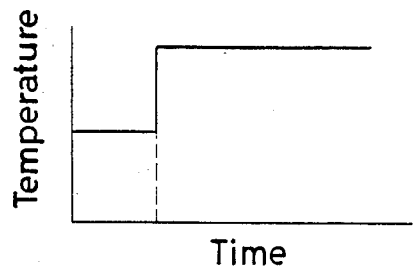
FIG. 9(A) is a graph showing the state of elevation of the temperature of the heater.
Figure 9B:
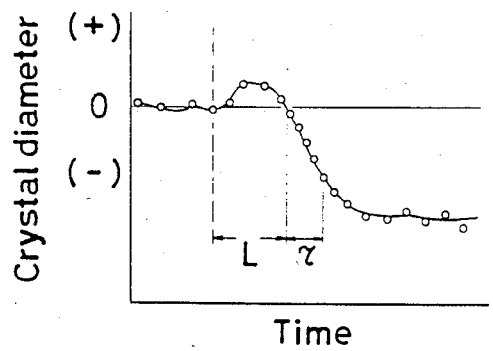
FIG. 9(B) is a graph showing time delay of change in the diameter of the crystal while the temperature of the heater is elevated in the state illustrated in FIG. 9(A).

III. Adjustment of Temperature of Fused Layer of Raw Material during Formation of Barrel Part of Crystal Now, the operation for controlling the diameter of the crystal in the barrel part through the tail end will be described. When the diameter of the growing crystal is controlled in accordance with the weight signal of the crystal, there inevitably occurs a time lag of "L" between the time the temperature of the heater is adjusted and the time the effect of this adjustment manifests itself in the magnitude of the diameter of the crystal as illustrated in FIG. 9(A). When the operating temperature of the heater is controlled by determining the value of compensation for temperature in accordance with the value of change dD/dt in the diameter of the crystal which is derived from the existent weight signal, it is after elapse of the time "L" that the control of the operating temperature manifests its effect upon the magnitude of the diameter of the crystal. It is after elapse of the time "L" plus the time constant $\tau$ that the change in the diameter of the crystal can be clearly detected. Thus, no accurate control can be obtained by this method.

In accordance with this invention, the weight of the growing crystal and the length of crystal pulling are continuously measured and the pattern of change in shape of the crystal is stored. Then, the pattern of change in shape of the crystal expected to exist after elapse of a stated length of time is predicted from the pattern of change in shape of the crystal which existed the stated length of time ago. The predicted pattern of the change in shape and the preset pattern of the change in shape are compared to fix the value of compensation for temperature of the heater and effect required control of the operating temperature of the heater accordingly.

To be more specific, the weight and the length of the growing crystal are continuously measured and the results of this measurement are forwarded to the processing circuit in much the same manner as in the control of the shoulder part of the crystal described above. In the processing circuit, the diameter of the crystal is determined based on these input values and the pattern of change in diameter is stored.

Figure 10:
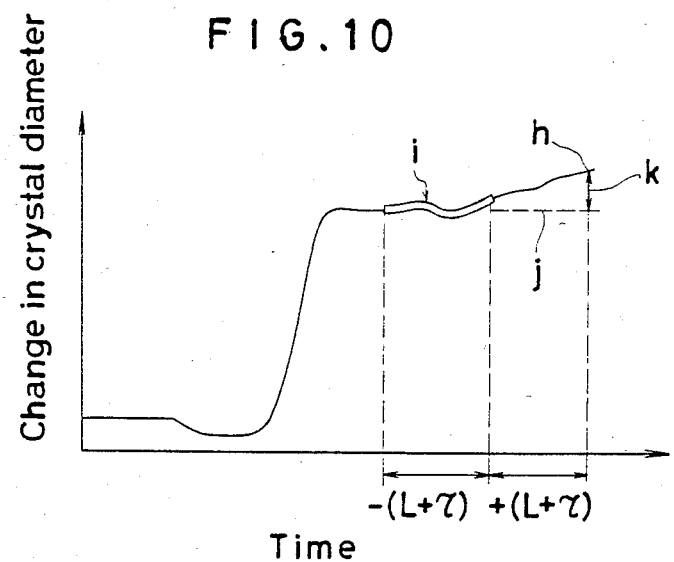
FIG. 10 is a graph showing the state of change in the diameter of the crystal.

FIG. 10 shows the amount of change in diameter of the crystal. The pattern of this change of the crystal which will exist after elapse of the length of time $L+\tau$ is predicted based on the pattern of change which existed the length of time $L-\tau$ ago and the pattern of change existing at present (the curve "i"). The predicted pattern of change and the preset pattern "j" of change are compared to determine the value of compensation for the operating temperature of the heater and effect required adjustment.

The response of the diameter of the crystal to the temperature is expressed by the formula (3).

$$\frac{dD}{dt} = K \cdot \frac{dT}{dt} (1 - e^{-(t-L)\tau}) 1(t - L) \quad (3)$$

In this formula, "D" stands for diameter of crystal, "T" for temperature, "L" for time lag, "t" for length of time, "$\tau$" for time constant, and 1(t−L) for unit step function.

From the pattern of change in diameter of the crystal between the diameter of crystal which existed a certain length of time ago and the diameter which is now existing, the existing amount of change $dD/dt_0$ in diameter is calculated by the curve fitting of the least squares method in accordance with the formula (3).

Based on the existing amount of change in diameter, the amount of change in diameter $\Delta D$ which is expected to occur after elapse of the length of time of $L+\tau$ is calculated in accordance with the formula (4).

$$\Delta D = dD/dt_0 (L+\tau) \quad (4)$$

The value of the change in temperature dT corresponding to the predicted amount $\Delta D$ of change in diameter is calculated in accordance with the formula (5).

$$dT = \frac{1}{K} \Delta D - \Delta T \quad (5)$$

By the value of compensation for temperature determined as described above, the operating temperature of the heater is corrected. The present invention, instead of giving the aforementioned value of compensation for temperature all at once to the heater and effecting abrupt compensation of the operating temperature of the heater, effects the required compensation gradually so that the total output of the compensation will manifest after elapse of the predicted length of time. Let $L+\tau$ stand for the time to be compensated, and the ratio of change of temperature per unit time dT/dt will be calculated in accordance with the formula (6).

$$dT/dt = \frac{1}{L+\tau}\left(\frac{1}{K}\Delta D - \Delta T\right) \qquad (6)$$

Figure 11A:
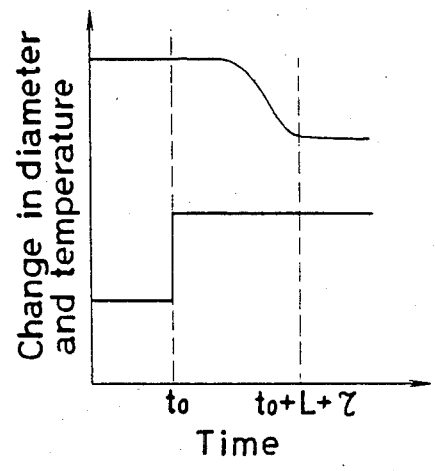
FIG. 11(A) is a graph illustrating the state of change in the diameter of the crystal while the growth of the crystal is effected by temperature-compensating the heater in a single step.

FIG. 11(A) depicts a case wherein the value of compensation for temperature accumulated up to the present moment is given all at once to the heater to effect desired control of the diameter of the crystal. When the operating temperature of the heater is immediately elevated and it is maintained at the elevated level from the time t0 to the time t0+(L+τ), the diameter of the crystal suddenly decreases after delay of the time 1. When the delivery of the value of compensation for temperature is gradually carried out over a period between the time t0 and the time t0+(L+τ) so that the largest value of compensation occurs at the end of this period, then the change in diameter of the growing crystal will be both smooth and slight.

IV. Compensation for Phenomenon of Reverse Response

Figure 12A:
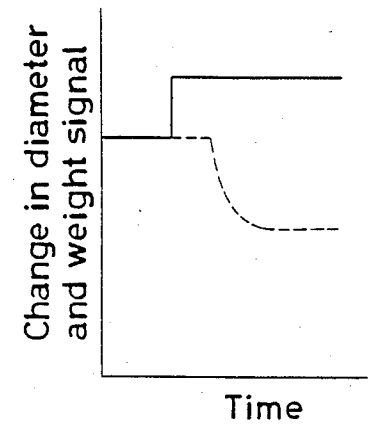
FIGS. 12(A) and 12(B) are graphs showing the relations between the heating temperature of the fused layer of raw material for the crystal and the amount of change in the signal indicating the weight of the crystal.
Figure 11B:
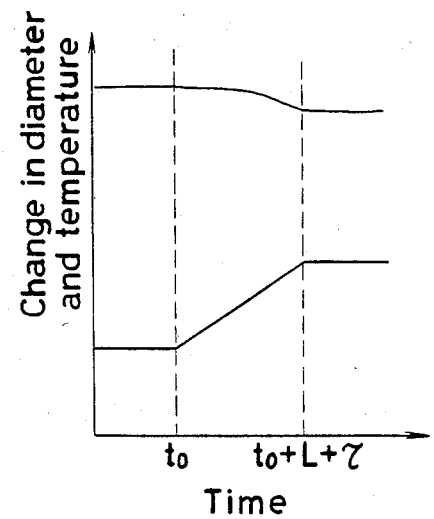
FIG. 11(B) is a graph showing the state of change in the diameter of the crystal while the growth of the crystal is effected by temperature-compensating the heater gradually.
Figure 12B:
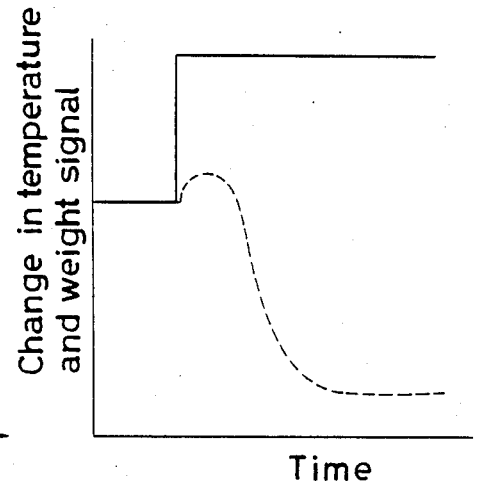
Figure 13:
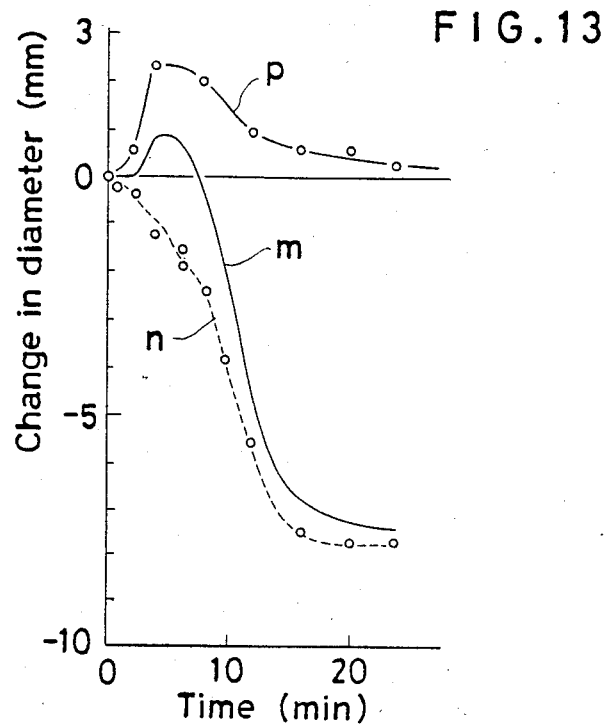
FIG. 13 is a graph showing the relation among the signal indicating the weight, the change in diameter, and the signal indicating reverse response during the growth of GaAs crystal.
Figure 14:
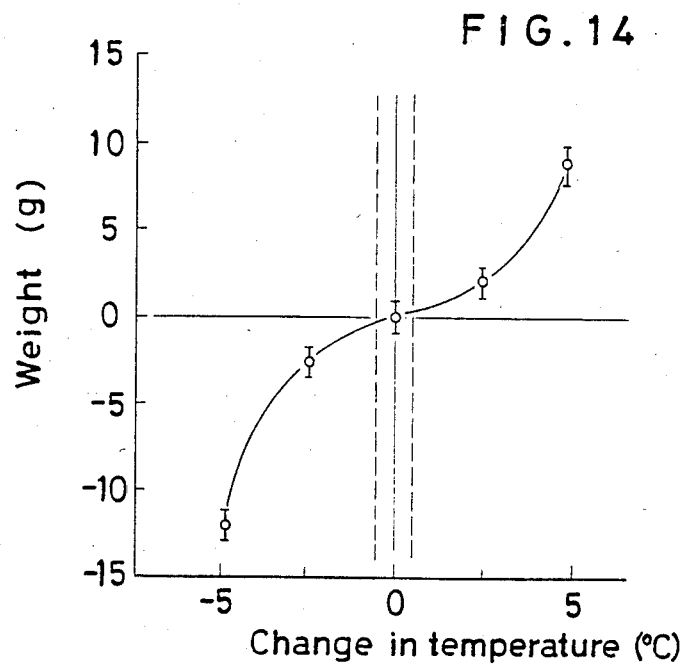
FIG. 14 is a graph showing the relation between the amount of change in temperature and the signal indicating reverse response.

In the case of a substance such as a III-V group compound of which the crystal density is smaller than the density of the fused layer, a sudden change in temperature of the fused layer during the growth of crystal entails the phenomenon of reverse response. When the temperature of the fused layer is elevated, there is issued a signal indicating a large ratio of increase in weight of the crystal, although the diameter of the crystal is actually decreased. When the temperature is lowered, there is issued a signal indicating a small ratio of increase, although the diameter of the crystal is increased. When the temperature of the fused layer during the growth of crystal is increased slightly as shown (the continuous line) in FIG. 12(A), the ratio of increase in weight signal of the crystal decreases after a lag of a certain length of time (the dotted line). When the temperature is suddenly increased as shown (the continuous line) in FIG. 12(B), however, the ratio of increase in weight signal of the crystal continues to rise for a certain length of time and suddenly falls thereafter (the dotted line). The phenomenon of reverse response, i.e. the rise of the ratio of increase in weight despite the decrease in diameter of the crystal, is widely known to be ascribable to the vertical shift of the meniscus of the neighborhood of the interface between the seed crystal and the fused layer of raw material. In the case of GaAs, this phenomenon occurs conspicuously when the temperature of the fused layer is changed by about 5° C. FIG. 13 is a graph showing the relation between the amount of change in diameter of the crystal and the length of time as measured when the temperature of the fused layer was increased by 5° C. while the fused layer was heated at 1260° C. and, at the same time, pulled up at a rate of 10 mm/hour to effect growth of a GaAs crystal 50 mm in diameter. In the graph, the curve "m" stands for the value of change in weight signal from the weight sensor as computed in terms of diameter, the curve "n" for the value of change in diameter of the actually growing crystal, and the curve "p" for the value of change in reverse response signal as computed in terms of diameter. These values satisfy the relation m−n=p. From this graph, it is noted that, when the temperature is increased, the diameter of the crystal begins to decrease and the decrease amounts to more than about 7 mm after elapse of 15 minutes and that, in accordance with the value of change "p" as computed to the weight signal, the diameter of the crystal increases by about 1 mm and, after elapse of about 10 minutes, begins to decrease.

A further study on the relation between the amount of change in temperature and the occurrence of the reverse response signal reveals that in the case of the example mentioned above, the reverse response signal which occurs when the amount of change in temperature for the adjustment of the heater is within ±0.5° C., the reverse response signal is amply small as compared with the noise component in the weight signal and refrains from affecting the control of the diameter, so that the control can be accurately effected without requiring any compensation for the reverse response (hereinafter referred to as "stable region"). It is revealed that when the amount of change in temperature exceeds ±0.5° C., the weight signal includes a reverse response signal exceeding the noise component (hereinafter referred to as "unstable region"). When the control of the diameter of the crystal is carried out by the conventional method, there ensues a phenomenon of oscillation, which prevents accurate control.

In the stable region, since the response of the diameter of crystal to the variation in temperature can be sufficiently approximated as a primary response, the function f(t) of the response of the diameter of crystal to the change of temperature can be expressed by the formula (7). In the unstable region, since the value resulting from the deduction of the value of reverse response signal from the value of signal of amount of change in weight represents the true amount of change in diameter, the function f(t) of the response can be expressed by the formula (8) as the reverse response component being compensated.

$$f(t) = K \cdot (1 - e^{-(t-L)/\tau})1(t-L) \qquad (7)$$

$$f(t) = [0.08K\{1-(1+0.1t)e^{-0.1t} - 0.035K \cdot t \cdot e^{-0.2t}\}]1(t) \qquad (8)$$

In the formulas, "K" stands for gain (amount of change in temperature), "e" for natural logarithm, "τ" for time constant, "t" for time, "L" for time lag, and 1(t) for unit step function.

The formulas given above are applicable to a typical growth of GaAs single crystal. When the construction and scale of the crucible, the conditions for crystal pulling, and the kinds of compounds to be pulled, etc. are varied, it becomes necessary to change the various constants "K", "τ" and "L", etc.

The method of the present invention comprises determining the ratio of increase by the weight signal of the crystal, judging the condition of the growth in diameter of the crystal, and when the ratio of increase is not equal to the stated value, determining the compensation value corresponding to the difference between the two values in accordance with the formula (7), adjusting the operating temperature of the heater based on the signal of the temperature compensation value, deciding whether or not the weight signal includes a reverse response signal and, when the inclusion of the reverse response signal is confirmed, determining the temperature compensation value in accordance with the formula (8), and repeatedly compensating the operating temperature of the heater based on the signal for temperature adjustment determined as described above.

Now, the method for the adjustment of the temperature of the fused layer of raw material for the crystal will be specifically described below with reference to FIG. 1. Growth of crystal is obtained by bringing the seed crystal 7 into contact with the fused layer 12 of raw material held within the crucible 3 and pulling the seed crystal up from the fused layer while rotating it about its axis. The weight of the growing crystal is continuously detected by the weight sensor 8 and forwarded to the processing circuit 13. The processing circuit 13 calculates the amount of change in diameter of the crystal based on the weight signal continuously brought in from the weight sensor 8, incessantly compares the ratio of increase with the preset value and, when the ratio of increase deviates from the preset value, calculates the temperature compensation value corresponding to the deviation in accordance with the formula (7), forwards the signal of compensation for temperature to the heater control circuit 14, and effects required control of the temperature of the heater 2. Generally when the control of this temperature is smoothly carried out, the width of the temperature compensation value in the case of GaAs falls in the range of ±0.5° C. and no reverse response signal is included.

When the weight signal forwarded to the processing circuit begins to increase notwithstanding the operating temperature of the heater is controlled so as to be increased by the signal for compensation of temperature, this increase of the weight signal signifies the inclusion of reverse response signal in the weight signal. In this case, the temperature compensation value is calculated from the amount of change in diameter determined from the weight signal or the preset value in accordance with the formula (8) and the signal for adjustment of the temperature is forwarded to the heater control circuit 14, and based on the signal for adjustment of temperature, effects the control of the heater which has been formerly controlled by the signal of the temperature compensation value including the reverse response signal. When the weight signal begins to decrease notwithstanding the operating temperature of the heater is controlled so as to be lowered, this decrease of the signal implies the inclusion of the reverse response signal. In this case, again, the same procedure will be carried out. After the duration involving the occurrence of the reverse response signal has elapsed, the temperature compensation value is calculated again in accordance with the formula (7) to effect required control of the temperature.

Actually, the range of the temperature compensation value which excludes the reverse response signal can be found empirically. This range is stored in the processing circuit. The control is effected in accordance with the formula (7) where the temperature compensation value falls within this range. This control is effected in accordance with the formula (8) when the temperature compensation value deviates from the aforementioned range. The weight signal of crystal measured during the growth of crystal is examined to determine whether or not it contains a reverse response signal. The adjustment of the temperature of the fused layer of raw material is effected depending on the outcome of the judgment, the single crystal obtained by the method of this invention enjoys improved quality.

V. Formation of Single Crystal by Automatic Control

The steps I–IV described above are aimed at adjusting the fused layer of raw material for the crystal to the temperature optimum for the respective steps and thereby ensuring production of a single crystal of fine quality. These steps may be applied independently to the manufacture of a single crystal. Now, the manufacture of a single crystal by automatic, continuous control of the successive steps, i.e. contact of the seed crystal with the fused layer, the formation of the shoulder part of the crystal, and the formation of the barrel part of the crystal, will be described.

The crucible is charged with prescribed amounts of elements as raw material for the crystal and a liquid encapsulant. This crucible is set in place within the high-pressure chamber and heated under pressure of an inert gas. After the raw material for the crystal and the liquid encapsulant have been thoroughly fused, the seed crystal is lowered in the direction of the fused layer. At this time, the magnitude of electric current flowing between the seed crystal and the crucible is measured. When the magnitude of electric current thus measured exceeds the preset value, this rise of the electric current is taken as a signal indicating the establishment of contact between the seed crystal and the fused layer of raw material. Then, the descent of the seed crystal is immediately stopped.

Then, the seed crystal now held in contact with the fused layer of raw material is left standing in that state for a prescribed length of time. The temperature condition of the fused layer is detected based on the weight signal and the electric current signal and, when necessary, suitably adjusted. After the fused layer has assumed the temperature condition befitting the pulling of crystal, the pulling of the seed crystal is started. Consequently, there ensues the formation of the shoulder part of the crystal.

During the formation of the shoulder part of the crystal, the diameter of the crystal is determined based on the weight signal and the length signal of the crystal. The angle of the shoulder part of the crystal calculated from the ratio of increase in diameter of the crystal is used as the signal for control. The angle of the shoulder part thus determined is compared with the preset angle of the shoulder part. When the difference between the two angles exceeds the allowable limit, the temperature of the fused layer of raw material is adjusted.

When the formation of the shoulder part is effected as described above and the diameter of the shoulder part has reached the prescribed size, the operation is shifted to the subsequent formation of the barrel part of the crystal.

During the formation of the barrel part of the crystal, the diameter of the crystal determined based on the weight signal and the length signal of the crystal is used as the control signal. Thus, the formation of the barrel part of the crystal is carried out by adjusting the temperature of the fused layer so as to maintain the diameter of the crystal constant. While the diameter of the crystal in the barrel portion thereof is on the increase, the diameter of the crystal which will exist after elapse of the length of time $T+\tau$ will be estimated by the curve fitting. Then the temperature of the fused layer is elevated based on the diameter of the crystal thus estimated so as to decrease the diameter of the crystal to the standard value. While the diameter of the crystal is decreasing, the diameter of the crystal is increased up to the standard value by lowering the temperature of the fused layer.

When the formation of the shoulder part of the crystal is carried out as described above, the production of the barrel part of the crystal is completed after the weight of the growing crystal has reached a stated value such as, for example, a level exceeding 80% of the weight of the fused layer of raw material. Then the temperature of the fused layer is lowered and the tail end of the grown crystal is severed from the fused layer. This severance of the grown crystal and the fused layer is confirmed by a change in magnitude of the electric current flowing between the crystal and the fused layer. Subsequently, the tail end of the grown crystal is pulled up above the liquid encapsulant, the operation of the heater is stopped, the produced single crystal is cooled, and the formation of the single crystal is completed.

As is plain from the foregoing description, the method of this invention produces a III-V group compound semiconductor single crystal of high quality with high repeatability because, during the manufacture of this single crystal, it carries out the growth of the crystal with the temperature of the fused layer of raw material for the crystal adjusted to the levels optimum for the pulling of crystal at the time of contact of the seed crystal with the fused layer and pulling of seed crystal, during the formation of the shoulder part of the single crystal, and during the formation of the barrel part of the single crystal. Particularly since the adjustment of the temperature of the fused layer to the optimum level is effected based mainly on the weight signal of the crystal and additionally on such external data as the signal of electric current and the signal of pulling length of crystal, complete automation of the growth of crystal can be materialized by the method of this invention.

Now, the present invention will be described more specifically below with reference to working examples.

EXAMPLE 1

In an apparatus for the manufacture of single crystal constructed as illustrated in FIG. 1, a cylindrical crucible of pyrolytic boron nitride 100 mm in inside diameter and 130 mm in depth was charged with 500 g of Ga and 550 g of As, with 150 g of $B_2O_3$ superposed as a liquid encapsulant on the charge. This crucible was set in place inside a high-pressure chamber and the interior of the chamber was compressed with argon gas to 30 atmospheres. Then, the crucible was heated to 1260° C., a temperature calculated to be optimum for the pulling of crystal at a pulling rate of 10 mm/hour. After the raw material and the liquid encapsulant were completely fused to form an upper fused layer of $B_2O_3$ and a lower fused layer of GaAs, an AC voltage of 15 V was applied between the pulling shaft and the crucible supporting member and the pulling shaft was slowly lowered. Detection of an electric current of 0.1 mA was confirmed to be a sign indicating the contact of the seed crystal with the surface of the fused layer of $B_2O_3$. As the descent of the seed crystal was further continued, the current increased to 0.4 mA and the weight sensor issued a weight signal of 1.0 g. This increase of the current was confirmed to be a sign indicating the contact of the leading end of the seed crystal with the surface of the fused layer of GaAs.

At this point, the descent of the seed crystal was stopped. After elapse of 15 minutes, the electric current suddenly fell to 0.1 mA. This sudden fall was confirmed as a sign indicating the severance of the seed crystal because the temperature of the fused layer was too high.

From the curve "b" in FIG. 5 corresponding to the pulling rate of 10 mm/hour, the temperature of the fused layer was found to be about 7° C. higher than the standard. Thus, the heater was adjusted to lower the temperature of the fused layer by 7° C. After the temperature of the fused layer fell by this depth, the seed crystal was brought into contact again with the surface of the fused layer and the electric current signal and the weight signal were measured thereafter for 15 minutes. The electric current signal was found to make no change at all and the weight signal was found to show a change of 0.007 g/min. From the graph of FIG. 6, it was judged that the temperature of the fused layer remained within the optimum temperature range for the pulling rate of 10 mm/hour. So, the crucible was rotated at a rate of 20 cycles per minute and the pulling shaft was rotated at a rate of 10 cycles per minute in the opposite direction and pulled up at a rate of 10 mm/hour for a total of 8 hours. Consequently, there was formed a cylindrical GaAs single crystal 50 mm in diameter, about 100 mm in length, and about 950 g in weight. The barrel part of this cylindrical single crystal was measured to find variation in diameter. The variation was within ±1%.

EXAMPLE 2

Under the same conditions as in Example 1, the raw material and the liquid encapsulant were fused. The crucible was heated to 1255° C., a temperature calculated to be optimum for the pulling of crystal. An AC voltage of 15 V was applied and the seed crystal was lowered. As in Example 1, the contact of the fused layer of $B_2O_3$ and the fused layer of GaAs was confirmed by the electric current signal.

On elapse of 15 minutes after the contact of the seed crystal and the fused layer of GaAs, no change was observed in the electric current and the amount of change in weight indicated by the weight signal was ±0.02 g/min. Thus, it was judged that the temperature of the fused layer was lower than the standard. So, the seed crystal was severed and the heater was adjusted to elevate the temperature of the fused layer by 2° C., a depth calculated based on the amount of change in weight. Then, the seed crystal was brought into contact again with the fused layer of GaAs and the electric current signal and the weight signal were measured. After elapse of 15 minutes, the electric current remained unchanged and the amount of change in the weight signal was 0.007 g/min. It was, therefore, judged that the temperature of the fused layer was 1° C. higher than the optimum temperature for the pulling rate of 15 mm/hour. The heater was adjusted to lower the temperature of the fused layer by 1° C. Thereafter, the crystal was pulled up at a rate of 15 mm/hour for a total period of about 5 hours. Consequently, there was formed a cylindrical GaAs single crystal 50 mm in diameter, about 90 mm in length and about 860 g in weight. The change in diameter of the barrel part of the single crystal thus obtained was within ±1%.

EXAMPLE 3

In the same apparatus as used in Example 1, the crucible was charged with 550 g of Ga and 550 g of As, a ratio indicative of excess addition of Ga, with 150 g of $B_2O_3$ superposed on the charge. The interior of the high-pressure chamber was compressed with argon gas to 20 atmospheres. Then, the crucible was heated to 1265° C. After the raw materials within the crucible were completely fused, an AC voltage of 20 V was applied and the seed crystal was lowered. The contact of the seed crystal with the fused layer of $B_2O_3$ was confirmed by detection of an electric current of 0.2 mA and the contact of the seed crystal with the fused layer of GaAs was confirmed by detection of an electric current of 0.6 mA. By the weight sensor, the weight of 0.8 g was detected.

On elapse of 12 minutes after the contact of the seed crystal with the fused layer of GaAs, severage of the seed crystal was confirmed from the electric current signal and the weight signal. Thus, it was judged from the graph of FIG. 5 that the temperature of the fused layer was 10° C. higher than the optimum temperature for the pulling rate of 10 mm/hour. So, the operating temperature of the crucible was lowered by 10° C. and the seed crystal was again brought into contact with the fused layer and left standing in that state for 15 minutes. During this standing, no change was observed in the electric current and the change in weight based on the weight signal was 0.005 g/min. The temperature of the fused layer, therefore, was lowered by 1° C. and the crystal was pulled at a rate of 10 mm/hour for a total of 7 hours. Consequently, there was formed a cylindrical GaAs single crystal 50 mm in diameter, about 100 mm in length and 960 g in weight. The change in diameter of the barrel part of this single crystal was within ±1%.

EXAMPLE 4

A cylindrical crucible of pyrolytic boron nitride 100 mm in inside diameter and 130 mm in depth was charged with 500 g of Ga and 550 g of As, with 150 g of $B_2O_3$ superposed as a liquid encapsulant on the charge. The crucible was set in place inside a high-pressure chamber. The interior of the chamber was compressed with argon gas to 30 atmospheres. Then the crucible was heated to 1260° C. After the raw materials and the liquid encapsulant were thoroughly fused, the seed crystal was lowered into contact with the fused layer.

In the processing circuit, data were stored in advance to permit the growing crystal to form the shoulder part at an angle of 65°. The pulling shaft was rotated at a rate of 6 cycles per minute and the crucible was rotated at a rate of 20 cycles per minute in the opposite direction and the seed crystal was pulled at a rate of 10 mm/hour. At the same time, the weight sensor and the position sensor attached to the pulling shaft were operated to forward the weight signal of crystal and the length signal of crystal to the processing circuit. The operating temperature of the heater was adjusted so as to keep the angle of the shoulder part of the growing crystal at the preset value.

The crystal pulling was continued for about 8 hours. Consequently, there was formed a cylindrical GaAs single crystal 50 mm in diameter, about 100 mm in length, and about 930 g in weight. The angle of the shoulder part of the single crystal was changed within the range of ±1° of the preset value of 65°. The shoulder part was smooth and showed virtually no fall or rise of the surface. Wafers were longitudinally cut out of the single crystal and tested for properties. The average density of dislocation was $1 \times 10^4$ cm$^{-2}$. The wafer cut from the crystal had dislocation density of U-shaped distribution.

For the purpose of comparison, the procedure described above was repeated, except that the differential value was adopted as the standard signal for the angle of the shoulder part. In this case, the angle of the shoulder part was changed within the range of ±10° of the preset value of 65°.

EXAMPLE 5

A cylindrical crucible of pyrolytic boron nitride 100 mm in inside diameter and 130 mm in depth was charged with 500 g of Ga and 550 g of As, with 150 g of $B_2O_3$ superposed as a liquid encapsulant on the charge. The crucible was set in place inside a high-pressure chamber. The interior of the chamber was compressed with argon gas to 20 atmospheres. Then, the crucible was heated to 1260° C. After the raw material and the liquid encapsulant were thoroughly fused, there were formed an upper fused layer of $B_2O_3$ and a lower fused layer of GaAs. The seed crystal was slowly lowered into contact with the fused layer of GaAs. After this contact, the pulling shaft was rotated at a rate of 10 cycles per minute and the crucible was rotated at a rate of 20 cycles per minute in the opposite direction. Under these conditions, the seed crystal was pulled up at a rate of 9 mm/hour. As the time required for prediction and for the compensation of temperature, 30 minutes which corresponds to the length of time $L+\tau$ under the existing conditions was used.

The weight and the length of the growing crystal were measured by the weight sensor and the position sensor and the results of the measurement were forwarded to the processing circuit. In the processing circuit, the pattern of change in shape of the crystal expected to exist 30 minutes afterward was predicted from the pattern of change in shape of the crystal which existed during the last 30 minutes of time. The predicted pattern was compared with the pattern of change in shape set in advance in the processing circuit. The temperature of the fused layer was gradually varied so that the value of compensation for temperature would be used up by the end of 30 minutes of time.

Under the conditions, the crystal was pulled up for about 8 hours. Consequently, there was formed a cylindrical GaAs single crystal 50 mm in diameter, about 100 mm in length, and about 900 g in weight. The change in diameter of this single crystal was within ±1%.

The procedure described above was repeated, except that the crucible was charged with 500 g of Ga and 570 g of As, a ratio representing excess addition of As. The single crystal consequently formed showed change of diameter within the range of ±0.5 mm of the standard value of 50 mm. A total of five single crystals were prepared under the same conditions. The change in diameter was invariably within ±1%.

EXAMPLE 6

The procedure of Example 5 was followed. After the raw material and the liquid encapsulant were thoroughly fused to give rise to an upper fused layer of $B_2O_3$ and a lower fused layer of GaAs, the seed crystal was lowered into contact with the surface of the fused layer of GaAs. Then, the seed crystal was rotated at a rate of 6 cycles per minute and the crucible was rotated at a rate of 20 cycles per minute in the opposite direction and the seed crystal was pulled up at a rate of 10 mm/hour. The diameter of the crystal pulled up after elaspe of about one hour was 50 mm. Based on the weight signal of the crystal measured by the weight sensor, the ratio of increase in weight was found to be 1.76 g/min. In the processing circuit, data were set in advance so that the temperature compensation owing to the change in diameter of the crystal calculated from the ratio of increase of weight was effected in accordance with the formula (7) and that the compensation, when the compensation value exceeded ±5° C., was effected in accordance with the formula (8). The pulling of the crystal was continued for 8 hours. Consequently, there was formed a cylindrical GaAs single crystal 95 mm in length and about 960 g in weight. The barrel part of this single crystal had a diameter of 50 mm. The ratio of change in diameter was within ±1.5%.

EXAMPLE 7

In the processing circuit, 300 g as the weight of the crystal, 30 mm as the length of crystal, 50 mm as the diameter of crystal, 0.2 mm/min as the minimum ratio of increase in diameter, and 60° as the angle of the shoulder part were fed in as data applicable to the formation of the shoulder part of crystal, and 800 g as the weight of crystal, 80 mm as the length of crystal, 50 mm as the diameter of crystal, and ±0.1 mm/min as the (allowable) ratio of change in diameter of crystal as data applicable to the formation of the barrel part of crystal.

Then, the same cylindrical crucible as used in Example 1 was charged with 500 g of Ga, 550 g of As, and 150 g of $B_2O_3$. The interior of the high-pressure chamber was compressed with argon gas to 20 atmospheres. Under the conditions, the fused layer of the raw material for the crystal was directly synthesized. The seed crystal was lowered in the direction of the fused layer. A sudden increase of the magnitude of electric current flowing between the seed crystal and the fused layer from 0.1 mA to 0.5 mA was taken as a sign indicating the contact of the seed crystal with the GaAs fused layer. At this time, the descent of the seed crystal was stopped and the seed crystal was left standing in that state for 10 minutes. The magnitude of electric current showed no change and the weight of crystal showed an inclination of increase. So, the seed crystal was pulled up at a rate of 9 mm/hour. Since the ratio of increase of diameter exceeded 0.2 mm/min, the crystal was allowed to form the shoulder part at an angle of 60°.

After the length of the shoulder part increased to about 15 mm, the diameter of the crystal was 50 mm, a value equaling the standard value set in advance in the processing circuit. Then, the operation was shifted to the step for the formation of the barrel part. during the growth of crystal, the temperature of the fused layer was adjusted so as to keep the diameter of crystal within the range of ±0.1 mm/min. When the length of crystal reached about 80 mm, the weight of crystal was measured to be 810 g, a value exceeding 80% of the weight of raw material. The temperature of the fused layer, therefore, was elevated gradually by about 70° C. The magnitude of electric current flowing between the crystal and the fused layer fell from 0.5 mA to 0.1 mA. This sudden fall of the magnitude of electric current was taken as a sign indicating the severance of the tail end of the crystal from the fused layer. The crystal was moved to 10 mm above the surface of $B_2O_3$ and allowed to cool off to room temperature at a rate of 100° C./hour.

Consequently, there was obtained a cylindrical GaAs single crystal 50 mm in diameter. The width of change in diameter was within ±0.25 mm. This single crystal had an average density of dislocation of $2 \times 10^4$ cm$^{-2}$ and resistance of $2 \times 10^8$ Ω·cm, the values testifying the crystal to excel in quality.

What is claimed is:

1. A method for manufacturing a III-V group compound semiconductor single crystal by bringing a seed crystal into contact with a fused layer of raw material for said single crystal kept sealed with a liquid encapsulant at high temperature under high pressure, adjusting the temperature of a heater serving to heat said fused layer and pulling up said seed crystal from said fused layer at a prescribed rate, which method comprises:

measuring said seed crystal in weight and concurrently causing an electric current to flow between said seed crystal and said fused layer to obtain a weight signal and an electric current signal and, based on said weight signal and said electric current signal, detecting occurrence of contact between said seed crystal and said fused layer, continuously measuring said weight signal and said electric current signal over a prescribed length of time following said contact between said seed crystal and said fused layer to obtain respective time-course change patterns and comparing said time course-change patterns with standard patterns, adjusting the temperature of said heater by a temperature compensation value corresponding to a difference found by the comparison, thereby adjusting the temperature of said fused layer to a level optimum for said prescribed rate of pulling up said seed crystal, and pulling up said seed crystal at said prescribed rate to sequentially form shoulder part, barrel part and tail end of said single crystal.

2. A method according to claim 1, wherein said contact between said seed crystal and said fused layer is detected when said weight signal and said electric current signal have exhibited high levels.

3. A method according to claim 1, wherein said shoulder part of the single crystal is formed by using as the standard signal the angle of said shoulder part relative to the axial direction of the single crystal.

4. A method according to claim 3, wherein the shape of said shoulder part of the single crystal is controlled by measuring the weight and length of the single crystal thereby determining the diameter of said single crystal, determining the angle of said shoulder part of the single crystal based on the ratio of increase in the diameter of the single crystal, comparing said determined angle with a standard angle, and adjusting the temperature of said heater based on the temperature compensation value corresponding to the difference found by said comparison.

5. A method according to claim 1, wherein growth of the single crystal is effected by measuring the weight and length of the single crystal thereby determining the diameter of said single crystal and storing the pattern of change in shape of the single crystal based on the data on the diameter of the barrel part and the tail end of the single crystal, predicting the pattern of change in shape of the single crystal expected to exist after elapse of a stated length of time, by curve fitting, from the pattern of change in shape of the single crystal which existed said length of time ago, comparing said predicted pattern of change with a preset pattern of change in shape, setting the temperature compensation value of said heater serving to heat said fused layer based on the difference found by said comparison, and giving said compensation value to said heater thereby controlling the operating temperature of said heater.

6. A method according to claim 1 or 5, wherein the weight signal of the single crystal measured by adjusting the temperature of said heater based on said temperature compensation value is examined to judge whether said weight signal contains a reverse response signal and, when the inclusion of said reverse response signal is confirmed, said temperature compensation value is itself compensated by a temperature adjustment value.

* * * * *